United States Patent [19]

Mazura

[11] Patent Number: 4,669,616

[45] Date of Patent: Jun. 2, 1987

[54] RACK FOR ACCOMMODATING INDUSTRIAL ELECTRONIC COMPONENTS

[75] Inventor: Paul Mazura, Waldbronn, Fed. Rep. of Germany

[73] Assignee: Schroff GmbH, Straubenhardt, Fed. Rep. of Germany

[21] Appl. No.: 449,875

[22] Filed: Dec. 15, 1982

[30] Foreign Application Priority Data

Dec. 15, 1981 [DE] Fed. Rep. of Germany ....... 3149542

[51] Int. Cl.⁴ .............................................. A47G 19/08
[52] U.S. Cl. ....................................... 211/41; 361/415
[58] Field of Search ........................... 211/41; 361/415

[56] References Cited

U.S. PATENT DOCUMENTS

| | | | |
|---|---|---|---|
| 3,511,385 | 5/1970 | Ayling | 211/41 |
| 3,733,523 | 5/1973 | Reynolds et al. | 361/415 |
| 3,915,307 | 10/1975 | Agarde | 361/415 X |
| 4,328,897 | 5/1982 | Weiss | 211/41 |
| 4,407,416 | 10/1983 | Anderson | 361/415 X |

FOREIGN PATENT DOCUMENTS

| | | | |
|---|---|---|---|
| 2374819 | 8/1978 | France | 361/415 |
| 422102 | 4/1967 | Switzerland | 361/415 |

Primary Examiner—Ramon S. Britts
Assistant Examiner—Blair M. Johnson
Attorney, Agent, or Firm—Antonelli, Terry & Wands

[57] ABSTRACT

A rack for accommodating industrial electronic components, with the rack including two side walls, two front connecting rails, and two rear connecting rails. The connecting rails are equipped or provided with fastening devices for enabling a fastening or mounting of printed circuit boards. In order to accommodate printed circuit boards of different sizes, the rack includes a front support rail interposed between one side wall and a support connecting the two front connecting rails to each other.

9 Claims, 3 Drawing Figures

U.S. Patent    Jun. 2, 1987    4,669,616
Fig. 1
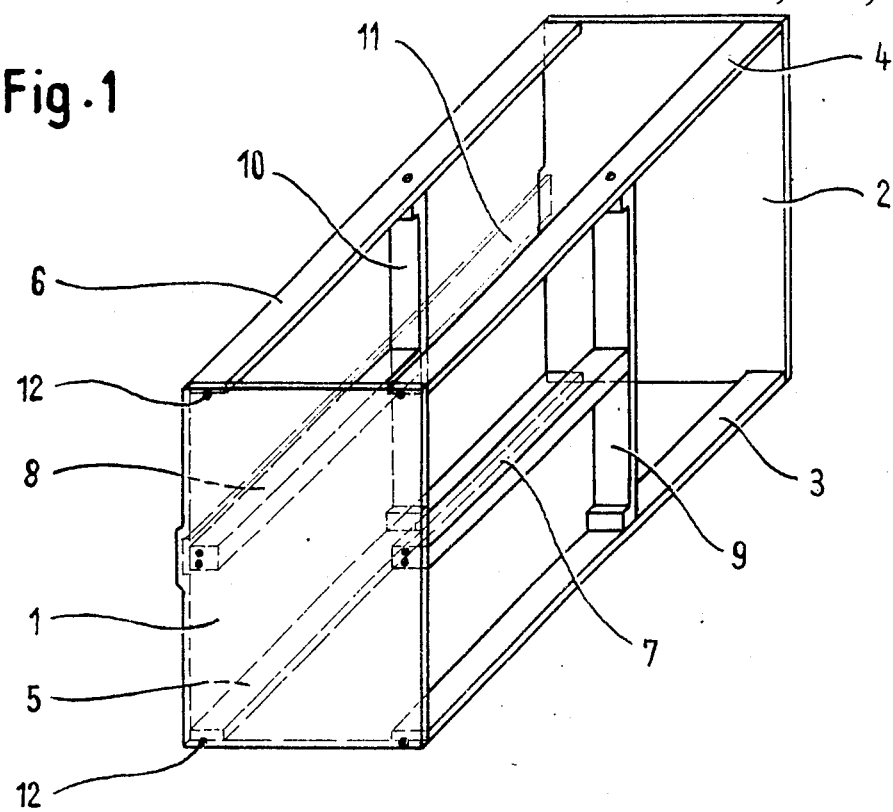
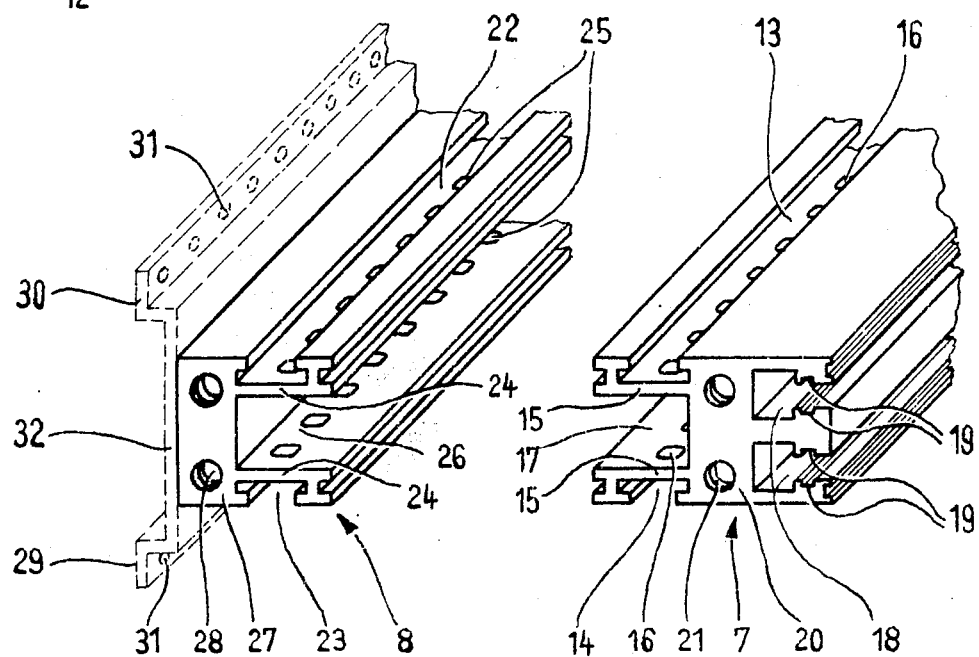
Fig. 3    Fig. 2

RACK FOR ACCOMMODATING INDUSTRIAL ELECTRONIC COMPONENTS

The present invention relates to a storage arrangement and, more particularly, to a rack for accommodating at least two different sizes of industrial electronic components such as, for example, printed circuit boards, with the rack including two side walls, two front and two rear connecting rails of equal length connecting the side walls, fastening means for guide rails for printed circuit boards and for plug-in modules, and addition support rails disposed centrally between the forward and rear connecting rails, respectively, as well as supports supporting the support rails.

Printed circuit boards on which circuits composed of electronic and electrical components are built are standardized and, for the most part, one standard size printed circuit board is used and, in many cases, a printed circuit board twice the size may also be used as well. A significant group of racks for accommodating industrial components of certain dimensions may hold two rows of the standard size PC boards stacked vertically and/or one row of double-sized PC boards so that the retaining elements in the racks must be disposed in a subdivided fashion. In order to effect this subdivision, support rails of different sizes and designs are required which necessitate large manufacturing inventories as well as cumbersome user installation of the racks since such racks are usually provided in the form of a fit.

The aim underlying the present invention essentially resides in providing a rack suitable for holding or accommodating PC boards of different sizes.

In accordance with advantages features of the present invention, a rack is provided wherein a forward support rail is equipped with two longitudinally or lengthwise extending grooves, with at least one row of holes being disposed in bottom surfaces or walls of the respective grooves. Two pairs of retaining grooves are disposed opposite one another for holding strips, with the grooves being provided with threaded holes therein. A support rail of the rack is shorter than the connecting rails and is adapted to be inserted between one side wall and a support. The support rail, by virtue of its specific construction, eliminates a previously required additional rail and its accompanying installation thereby resulting in an advantage of a more diverse application for the rack.

In accordance with further features of the present invention, a rear support rail is equipped with two longitudinally or lengthwise extending grooves having T-shaped cross sections as well as a row of holes disposed in bottom surfaces or walls of the grooves. A support rail is of the same length as the front support rail and is interposed between the same side wall and a support. When this support rail is employed, one rails formerly required can also be eliminated in many cases.

Advantageously, in accordance with still further features of the present invention, the rear support rail supports or includes two flanges, with the flanges being bent twice at right angles and provided with rows of threaded holes, which flanges are adapted to serve for fastening plug-in modules.

In order to faciliate manufacturing and provide for maximum flexibility in a construction of the rack of the present invention, the two flanges may be constructed in one piece and may be threadably secured to a back of the rear support rail.

Additionally, for certain applications of the rack of the present invention, it may also be advantageous to provide a mounting strip supporting the two flanges provided with the rows of threaded holes to be disposed along a back of the rear support rail, with the strip being fastened by its end surfaces to the two side walls.

Accordingly, it is an object of the present invention to provide a rack for accommodating industrial electronic components which avoids, by simple means, shortcomings and disadvantages encountered in the prior art.

A further object of the present invention resides in providing a rack for accommodating industrial electronic components which enables a simplifying of component inventories.

Yet another object of the present invention resides in providing a rack for accommodating industrial components which is easy to assemble and substantially shortens the time for erecting the rack.

A further object of the present invention resides in providing a rack for accommodating industrial electronic components which has a significantly increased stability.

A still further object of the present invention resides in providing a rack for accommodating industrial electronic components which enables a total reduction in the overall cost of manufacturing.

Yet another object of the present invention resides in providing a rack for accommodating industrial electronic components which enables a maintenance of closer tolerances as well as enabling a reduction in the inventory.

These and other objects, features, and advantages of the present invention will become more apparent from the following description when taken in connection with the accompanying drawings which show, for the purposes of illustration only, one embodiment in accordance with the present invention, and wherein:

FIG. 1 is a partially schematic perspective view, on a reduced scale, of a rack for accommodating industrial electronic components constructed in accordance with the present invention;

FIG. 2 is a perspective view, on a reduced scale, of a front support rail of the rack of FIG. 1; and FIG. 3 is a perspective view, in the same scale of FIG. 2, of a rear support rail of the rack of FIG. 1.

Referring now to the drawings wherein like reference numerals are used throughout the various views to designate like parts and, more particularly, to FIG. 1, according to this figure, a rack for accommodating industrial electronic components is composed of a plurality of individual elements or components forming a part of a kit manufactured and offered by a factory with the kit comprising everything including the connecting or fastening means such as, for example, bolts or the like, required to construct the desired rack. Advantageously, as a rule, all of the elements or components are fashioned of aluminum.

As shown in FIG. 1, the rack includes two flat rectangular side walls 1, 2 which are identical to each other, two front connecting rails 3, 4, two rear connecting rails 5, 6, a front support rail 7, a rear support rail 8, two supports 9, 10, and additionally a fastening strip 11 may be provided.

The four connecting rails 3, 4, 5, 6, of equal length, connect the two side walls 1, 2 and form a rigid rectangular frame together with the side walls 1, 2. Connecting rails 3, 4, 5, 6 are provided with threaded holes at their respective ends and are adapted to be bolted or secured by, for example, steel bolts 12 to the side walls 1, 2. All four connecting rails 3, 4, 5, 6 are provided with mounting devices (not shown) in the form of lengthwise grooves, rows of holes, and rows of threaded holes, for enabling an insertion of guide rails (not shown) made of, for example, a plastic material, for accommodating slide-in PC boards (not shown) and for enabling a bolting or securing of electrical plug-in modules (not shown).

As also shown in FIG. 1, the front support rail 7, having a length shorter than connecting rails 3, 4, 5, 6, is interposed between one side wall 1 and a support 9 which connects the two front connecting rails 3, 4.

As shown in FIG. 2, the support rail 7 is provided with two longitudinally or lengthwise extending grooves 13, 14, each having a T-shaped cross sectional configuration. The grooves 13, 14 are disposed in a mirror-like image with respect to each other. Each of the grooves 13, 14 include a bottom surface or wall 15 with at least one row of aligned holes 16 being provided in the bottom surface or wall 15. The bottom surface or wall 15 of the grooves 13, 14 define therebetween a deep wide U-shaped groove 17. The rows of holes 16 and longitudinally extending grooves 13 serve for enabling an insertion of guide rails (not shown). Two longitudinally or lengthwise extending slots 18 are cut into a forward portion of the support rail 7, with two pairs of retaining grooves 19, disposed opposite to one another, being arranged in the slots 18. The retaining grooves 19 serve to retain strips with threaded holes (not shown), which can be inserted into the retaining grooves 19 in a longitudinal direction of the support rails 7. Two threaded holes 21, machined in the end surfaces 20 at either end of the support rail 7, enable the support rail 7 to be bolted to the side wall 1 and the support 9.

The rear support rail 8, having a length which is the same as that of the front support rail 7, is interposed between the side wall 1 and a support 10 connecting the two rear connecting walls 5, 6 to each other. Additionally, as shown most clearly in FIG. 3, the support rail 8 is provided with two longitudinally or lengthwise extending grooves 22, 23, substantially T-shaped in cross sectional configuration and located in a mirror image opposite to one another for fastening or accommodating guide rails (not shown). At least one row of aligned holes 25 is provided in the bottom surface or wall 24 of the grooves 22, 23, with the bottom surface or wall 24 of the grooves 22, 23 defining therebetween a U-shaped groove 26. Two threaded holes 28 are machined in the respective end surfaces 27 for enabling a securing of the rear support rail 8 to the side wall 1 and support 10 by suitable fasteners such as, for example, bolts or the like.

The mounting strip 11, illustrated in phantom line in FIG. 1, is interposed between the two side walls 1, 2 and bolted thereat. The mounting strip 11 includes two flanges, with each of the flanges provided with rows of threaded holes for enabling a mounting of electrical plug-in connections.

The rear support rail 8, as shown in phantom line in FIG. 3, may be provided with two flanges 29, 30 directed toward one another and bent twice at right angles, with the flanges 29, 30 each being provided with at least one row of threaded holes 31. The rear support rail 8 may be provided with these flanges 29, 30 if the rack has no mounting strip 11, which would be the case when the industrial electronic components to be installed in the rack are of such dimensions that their installation depth would leave no space for accommodating the mounting strip 11.

It is also possible for the two flanges 29, 30 to be formed of one piece of a strip of material which could be secured to the back of the rear support rail 8 by, for example, bolts or the like.

In the rack of FIG. 1, large and small PC boards can be installed after the rack is equipped with guide rails. The large PC boards may be disposed on the right side, with the small PC boards being fitted or accommodated on the left side and stacked vertically in two rows.

If, in special circumstances, the rack is provided exclusively to receive two rows of PC boards of the standard size, the two supports 9, 10 may be dispensed with and the front support rail 7 as well as the rear support rail 8 can then be interposed directly between the two side walls 1, 2. In this last mentioned arrangement, the two support rails 7, 8 must have the same length as the connecting rails 3, 4, 5, 6.

While I have shown and described only one embodiment in accordance with the present invention, it is understood that the same is not limited thereto but is susceptible of numerous changes and modifications as known to one having ordinary skill in the art and I therefore do not wish to be limited to the details shown and described herein, but intend to cover all such modifications as are encompassed by the scope of the appended claims.

I claim:

1. A rack for accommodating industrial electronic components, the rack comprising two spaced side walls, a pair of spaced, horizontally extending front connecting rail means for connecting the side walls to each other, a pair of spaced, horizontally extending rear connecting rail means for connecting the side walls to each other, a forward support rail means disposed substantially between the pair of spaced front connecting rail means for supporting the industrial electrical components, and a rearward support rail means disposed substantially centrally between the rear connecting rail means for supporting the industrial electronic components, characterized in that the forward support rail means includes two substantially T-shaped longitudinally extending grooves, each of said T-shaped longitudinally extending grooves including a bottom wall portion, lying in a horizontal plane, said bottom wall portions being vertically spaced apart at least one row of aligned holes disposed in the bottom wall portion of each of said grooves, and two pairs of oppositely disposed retaining groove means provided on the forward support rail means and adapted to accommodate mounting strips of the industrial electronic components.

2. A rack according to claim 1, characterized in that a pair of further support means are arranged between the side walls, each of said further support means being respectively disposed between and secured to the front connecting rail means and the rear connecting rail means, and in that the forward support rail means has a length less than a length of the connecting rail means.

3. A rack according to claim 2, characterized in that a rearward support rail means is provided with two substantially T-shaped longitudinally extending grooves, each of said substantially T-shaped longitudinally extending grooves including at least one row of aligned holes in a bottom wall portion thereof, and in that said rearward support rail means is of substantially the same length as the front support rail means and is disposed between one of the side walls and the further support means secured to the rear connecting rail means.

4. A rack according to claim 3, characterized in that flange means are provided on the rearward support rail means, and in that at least one row of aligned holes are arranged in the flange means for enabling a securing of the industrial electronic components.

5. A rack according to claim 4, characterized in that the flange means includes two flanges bent twice at substantially a right angle and disposed above and below the rearward support rail means.

6. A rack according to claim 4, characterized in that the flange means includes a strip portion bent along longitudinally extending edges thereof so as to form two spaced flanges, and in that the strip portion is secured to a rear surface of the rearward support rail means.

7. A rack according to claim 3, characterized in that the mounting strip means is secured to the two side walls for facilitating a mounting of the rearward support rail means.

8. A rack according to claim 7, characterized in that the mounting strip means includes two spaced flange means, and in that at least one row of aligned threaded holes are provided in the respective flange means for enabling a securing of the industrial electronic components.

9. A rack according to claim 1, characterized in that flange means are provided on the rearward support rail means, and in that at least one row of aligned holes are arranged in the flange means for enabling a securing of the industrial electronic components.

* * * * *